(12) United States Patent
Yun et al.

(10) Patent No.: US 7,750,703 B2
(45) Date of Patent: Jul. 6, 2010

(54) DUTY CYCLE CORRECTING CIRCUIT

(75) Inventors: Won Joo Yun, Ichon (KR); Hyun Woo Lee, Ichon (KR); Dong Suk Shin, Ichon (KR)

(73) Assignee: Hynix Semiconductor Inc. (KR)

( * ) Notice: Subject to any disclaimer, the term of this patent is extended or adjusted under 35 U.S.C. 154(b) by 41 days.

(21) Appl. No.: 11/959,368

(22) Filed: Dec. 18, 2007

(65) Prior Publication Data

US 2008/0252349 A1    Oct. 16, 2008

(30) Foreign Application Priority Data

Apr. 12, 2007    (KR) ................ 10-2007-0035822

(51) Int. Cl.
   *H03K 5/04* (2006.01)
(52) U.S. Cl. .................... 327/175; 327/172
(58) Field of Classification Search .......... 327/172–176
   See application file for complete search history.

(56) References Cited

U.S. PATENT DOCUMENTS

| | | | |
|---|---|---|---|
| 6,819,155 B1 | 11/2004 | Ling et al. | |
| 6,853,225 B2 | 2/2005 | Lee | |
| 6,859,081 B2 | 2/2005 | Hong et al. | |
| 6,963,235 B2 | 11/2005 | Lee | |
| 7,015,739 B2 * | 3/2006 | Lee et al. | 327/175 |
| 7,180,346 B2 * | 2/2007 | Lee | 327/175 |
| 7,199,634 B2 * | 4/2007 | Cho et al. | 327/175 |
| 2004/0066873 A1 | 4/2004 | Cho et al. | |
| 2006/0197565 A1 | 9/2006 | Kang | |

FOREIGN PATENT DOCUMENTS

| | | |
|---|---|---|
| JP | 2004129255 | 4/2004 |
| KR | 1020040084516 A | 10/2004 |
| KR | 1020050040551 A | 5/2005 |

* cited by examiner

*Primary Examiner*—An T Luu
(74) *Attorney, Agent, or Firm*—Baker & McKenzie LLP

(57) ABSTRACT

A duty cycle correcting circuit includes a duty ratio control signal generating block that detects a duty ratio of input clock signals and generates a duty ratio control signal comprising a plurality of bits, a power supply block that supplies a voltage to output nodes, and a signal processing block that controls voltage levels of the output nodes to correspond to voltage levels of the input clock signals in response to the plurality of bits of duty ratio control signals.

20 Claims, 4 Drawing Sheets

DUTY CYCLE CORRECTING CIRCUIT

CROSS-REFERENCE TO RELATED APPLICATION

This application claims priority under 35 U.S.C. 119(a) to Korean Patent Application No. 10-2007-0035822 filed on Apr. 12, 2007 in the Korean Intellectual Property Office, the disclosure of which is incorporated herein by reference in its entirety as if set forth in full.

BACKGROUND

1. Technical Field

The embodiments described herein relate to semiconductor integrated circuits, and more particularly, to apparatus and methods for performing stable duty cycle correction operation on clocks in a semiconductor integrated circuit.

2. Related Art

In general, semiconductor integrated circuits, such as synchronous dynamic random access memories (SDRAMs), process data using clocks to improve the operational speed of the circuit. Accordingly, if a ratio between a rising edge period and a falling edge period, i.e., the duty ratio, of clocks related or used for processing data is mismatched, the operation efficiency can be decreased. However, a clock that is actually used in a semiconductor integrated circuit seldom has a predetermined duty ratio because of various factors, such as a noise, that arise once the semiconductor integrated circuit is mounted, e.g., on a Printer Circuit Board (PCB). Thus, a conventional semiconductor integrated circuit generally includes a duty cycle correcting circuit that corrects a duty ratio of the clocks to improve the operation efficiency.

Such a conventional duty cycle correcting circuit has been implemented in such a manner that the duty cycle correcting circuit includes a dual loop, and is configured to match rising edges of two clocks and mix the phases of the two clocks.

Generally, however, a conventional duty cycle correcting circuit has a complicated structure, and may produce errors when the rising edges of the two clocks at issue are mismatched to each other. Such mismatches are common in conventional semiconductor integrated circuits due to changes in the Process, Voltage, and Temperature (PVT) effecting or related to the device. For this reason, the operation efficiency of conventional duty cycle correcting circuit can be poor, and they can produce errors. Further, conventional duty cycle correcting circuit tend to occupy a large area and consume a significant amount of power. Further, it can be difficult to implement design changes to improve the performance or reduce the footprint of conventional duty cycle correcting circuits.

SUMMARY

A duty cycle correcting circuit configured to perform stable duty cycle correcting operations is described herein.

According to one embodiment, a duty cycle correcting circuit includes a duty ratio control signal generating block that detects a duty ratio of input clock signals and generates a duty ratio control signal comprising a plurality of bits, a power supply block that supplies a voltage to output nodes, and a signal processing block that controls voltage levels of the output nodes to correspond to voltage levels of the input clock signals in response to the plurality of bits of the duty ratio control signal.

According to another embodiment, a duty cycle correcting circuit includes a duty ratio control signal generating block that detects a duty ratio of a pair of input clock signals and generates a duty ratio control signal comprising a plurality of bits, and a plurality of signal processing units, each of which is selectively activated by the plurality of bits of the duty ratio control signal, and generates a pair of output clock signals from the pair of input clock signals according to a driving force produced by a pair of elements that receive the pair of input clock signals, respectively.

These and other features, aspects, and embodiments are described below in the section entitled "Detailed Description."

BRIEF DESCRIPTION OF THE DRAWINGS

The above and other features and advantages will become more apparent by describing in detail exemplary embodiments thereof with reference to the attached drawings in which.

DETAILED DESCRIPTION

Figure 1:
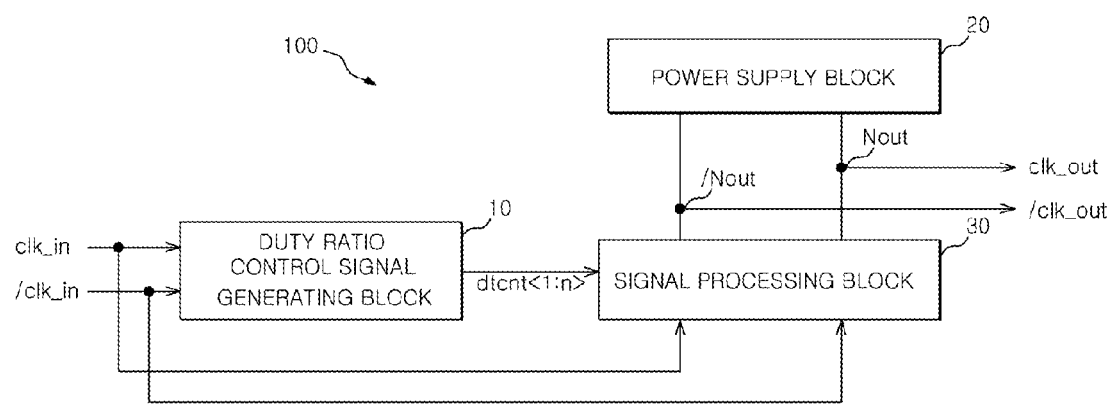
FIG. 1 illustrates a block diagram of a duty cycle correcting circuit according to an embodiment.

FIG. 1 illustrates a block diagram a duty cycle correcting circuit 100 configured in accordance with one embodiment. As can be seen, circuit 100 includes a duty ratio control signal generating block 10, a power supply block 20, and a signal processing block 30.

The duty ratio control signal generating block 10 can be configured to detect a duty ratio of a pair of input clock signals (clk_in) and (/clk_in) and to generate duty ratio control signals (dtcnt<1:n>). Thus in this example, the duty ratio control signals are n-bit signals. The power supply block 20 supplies a voltage to a pair of output nodes Nout and /Nout from which a pair of output clock signals (clk_out) and (/clk_out) are output, respectively. The signal processing block 30 controls voltage levels of the pair of output nodes Nout and /Nout based on the n-bits of the duty ratio control signal (dtcnt <1:n>) to correspond to voltage levels of the pair of input clock signals (clk_in) and (/clk_in).

In this case, the pair of input clock signals (clk_in) and (/clk_in) can be a pair of clock signals or a pair of data output clock signals generated by a DLL circuit in a semiconductor integrated circuit. It will be understood that the pair of input clock signals (clk_in) and (/clk_in) are not limited to specific clock signals. That is, the pair of input clock signals (clk_in) and (/clk_in) can be any clock signals input to the duty cycle correcting circuit to correct a duty cycle.

The signal processing block 30 can include n signal processing units (not shown) that respectively correspond to the n-bits of duty ratio control signals dtcnt<1:n>. Certain of the n-bits can be at a first level, e.g. a high level. Only those signal processing units that receive a bit at the first level will be activated.

The power supply block 20 and the n signal processing units (not shown) can be configured to form a differential amplifier. In such embodiments, the power supply block 20 becomes a pull-up unit of the differential amplifier and each of the n signal processing units become a pull-down unit of the differential amplifier. However, the embodiments described herein are not limited to such a configuration, and the power supply block 20 can, e.g., become the pull-down unit and the n signal processing units can, e.g., become the pull-up unit.

The structures of the power supply block 20 and the signal processing block 30 will be described in detail with reference to FIG. 2.

Figure 2:
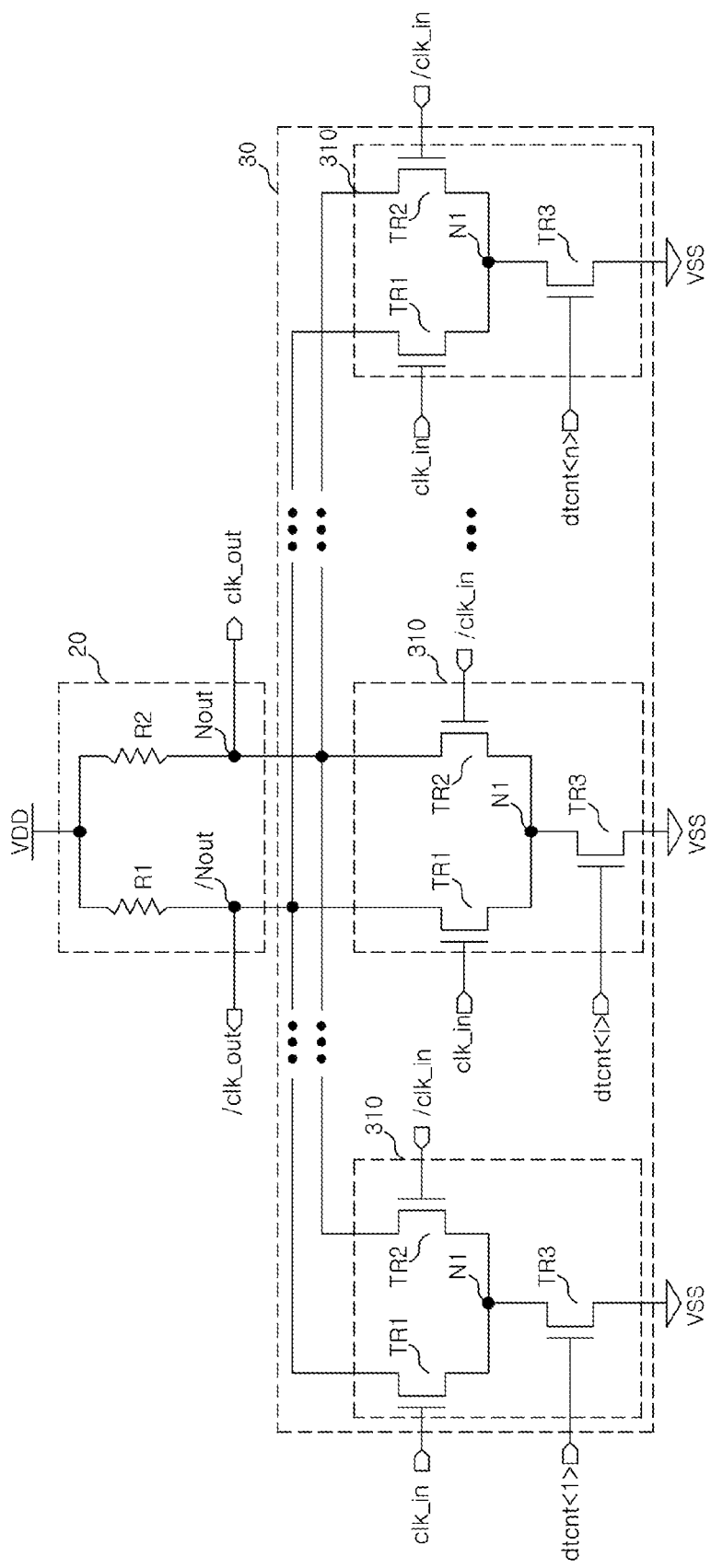
FIG. 2 illustrates a structure of a power supply block and a signal processing block according to FIG. 1.

As shown in FIG. 2, the power supply block 20 can include a first resistor R1 and a second resistor R2. The first resistor R1 is provided between an external power supply VDD and the negative output node /Nout. The second resistor R2 is provided between the external power supply VDD and the positive output node Nout.

The signal processing block 30 includes the n signal processing units 310 that respectively correspond to the n bits of duty ratio control signal (dtcnt<1:n>). Specifically, each of the n signal processing units 310 is activated by one bit of the n bits of duty ratio control signals (dtcnt<1:n>), and controls the voltage levels of the pair of output nodes Nout and /Nout to correspond to the voltage levels of the pair of input clock signals (clk_in) and (/clk_in).

Each of the n signal processing units 310 includes a first transistor TR1, a second transistor TR2, and a third transistor TR3. The first transistor TR1 is provided between the negative output node /Nout and the first node N1 and operates according to the control of the positive input clock signal (clk_in). The second transistor TR2 is provided between the positive output node Nout and the first node N1 and operates according to the control of the negative input clock signal (/clk_in). The third transistor TR3 is provided between the first node N1 and a ground terminal and operates according to the control of any one dtcnt<i> of the n bits of duty ratio control signals (dtcnt<1:n>).

In this case, the positive input clock signal (clk_in) and the negative input clock signal (/clk_in) have phases that are opposite to each other, and are used as the pair of input clock signals (clk_in) and (/clk_in). The pair of output clock signals (clk_out) and (/clk_out) are implemented as the positive and negative output clock signals (clk_out) and (/clk_out) the phases of which are opposite to each other. Therefore, the positive output clock signal (clk_out) is applied to the positive output node Nout, and the negative output clock signal (/clk_out) is applied to the negative output node /Nout.

Any one of the n bits of duty ratio control signal (dtcnt<1:n>) can activate any one of the signal processing units 310, and the signal processing block 30 corrects the duty ratio of the input clock signal (clk_in) according to a resistance ratio between the first transistor TR1 and the second transistor TR2 of the activated signal processing unit 310 thereby generating the output clock signal (clk_out). That is, the resistance ratio between the first transistor TR1 and the second transistor TR2, which are included in each of the n signal processing units 310, is different. The amount of current is different according to each resistance ratio in each signal processing unit 310 that has been activated. Therefore, it is possible to minutely control the voltage levels of the pair of output clock signals (clk_out) and (/clk_out). The resistors included in each signal processing unit 310 can be implemented to produce a resistance ratio required for a particular implementation.

For example, when n is 4, the logical values of the 4 bits of the duty ratio control signal (dtcnt<1:n>) can be (0, 0, 0, 1), and this state can be assumed as a state where the high-level interval of the positive input clock signal (clk_in) is narrower than the low-level interval thereof. In this case, the activated signal processing unit 310 can include a first transistor TR1 that has a small resistance value and a second transistor TR2 that has a large resistance value. Accordingly, the speed, at which the first transistor TR1 pulls down the voltage level of the negative output node /Nout to a low level is decreased, and the speed at which the second transistor TR2 pulls down the voltage level of the positive output node Nout to a low level is increased. As a result, the duty ratio of the pair of output clock signals (clk_out) and (/clk_out) can be corrected.

In the same manner, when n is 4, the logical values of 4 bits of duty ratio control signal (dtcnt<1:n>) can be (1, 0, 0, 0), and this state can be assumed as a state where the high-level interval of the positive input clock signal (clk_in) is wider than the low-level interval thereof. In this case, the activated signal processing unit 310 includes a first transistor TR1 that has a small resistance value and a second transistor TR2 that has a large resistance value. Accordingly, the speed, at which the first transistor TR1 pulls down the voltage level of the negative output node /Nout to a low level is increased, and the speed at which the second transistor TR2 pulls down the voltage level of the positive output node Nout to a low level is decreased. As a result, the duty ratio of the pair of output clock signals (clk_out) and (/clk_out) can be corrected.

Figure 3:
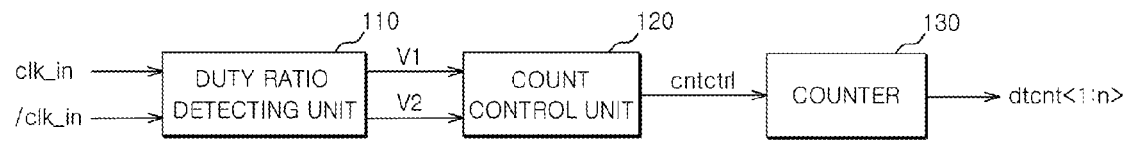
FIG. 3 illustrates a structure of a duty ratio control signal generating block according to FIG. 1.

FIG. 3 shows a structure of a duty ratio control signal generating block 10 in more detail. As can be seen, the duty ratio control signal generating block 10 can include a duty ratio detecting unit 110, a count control unit 120, and a counter 130.

The duty ratio detecting unit 110 can be configured to detect the duty ratio of the pair of input clock signals (clk_in) and (/clk_in) and to generate a first voltage V1 and a second voltage V2. The count control unit 120 can be configured to generate a count control signal (cntctrl) in response to the voltage levels of the first voltage V1 and the second voltage V2. The counter 130 can perform a counting operation in response to the count control signal (cntctrl) and generate the duty ratio control signals (dtcnt<1:n>).

In this case, the first voltage V1 is used to load a length of a high-level interval of the positive input clock signal (clk_in) by a voltage level thereof. The second voltage V2 is used to load a length of a high-level interval of the negative input clock signal/(clk_in), that is, a length of a low-level interval of the positive input clock signal (clk_in), by a voltage level thereof.

The duty ratio information of the pair of input clock signals (clk_in) and (/clk_in), which is indicated by the voltage levels of the first voltage V1 and the second voltage V2, is transmitted to the count control unit 120. As a result, the count control unit 120 controls the operation of the counter 130 by using the count control signal (cntctrl). The counter 130 increases or decreases the logical values of the n-bits of the duty ratio control signals (dtcnt<1:n>) according to the voltage level of the count control signal (cntctrl).

For example, if the duty ratio detecting unit 110 detects that the high-level interval of the positive input clock signal (clk_in) is narrow, the count control unit 120 drives the count control signal (cntctrl) to a high level. In response, the counter 130 increases the logical values of the n-bits of the duty ratio control signals (dtcnt<1:n>). In the same manner, if the duty ratio detecting unit 110 detects that the high-level interval of the positive input clock signal (clk_in) is wide, the count control unit 120 generates the count control signal (cntctrl) at a low voltage level. The counter 130 then decreases the logical values of the n-bits of duty ratio control signals (dtcnt<1:n>).

Figure 4:
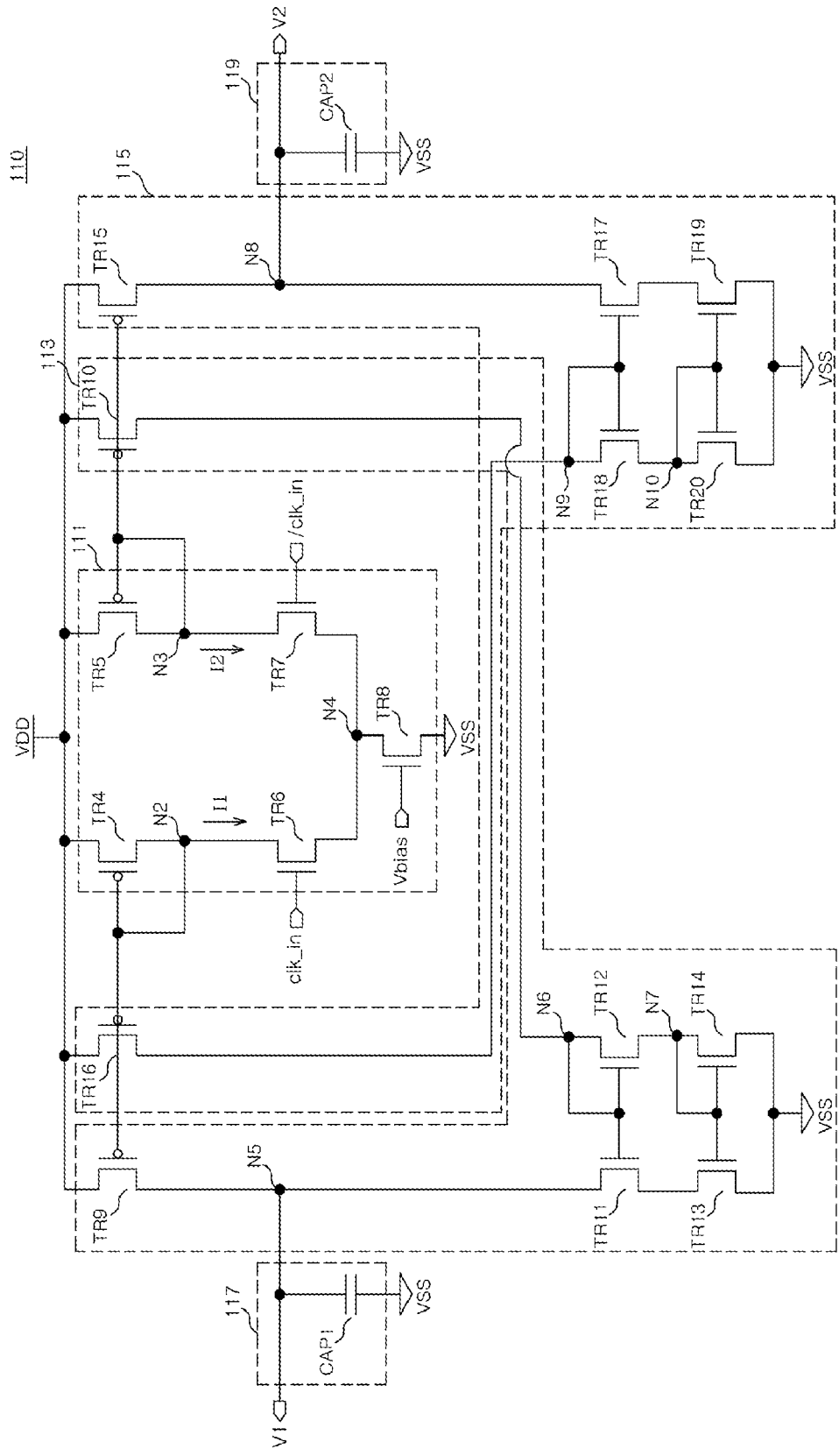
FIG. 4 is a diagram illustrating a structure of a duty ratio detecting unit according to FIG. 3.

FIG. 4 shows a structure of an example duty ratio detecting unit that can be included in the duty ratio control signal generating block 10 shown in FIG. 3. As can be seen, the duty ratio detecting unit 110 can include a comparing unit 111, first and second charge control units 113 and 115, and first and second charging units 117 and 119.

The comparing unit 111 can be supplied with a bias voltage Vbias and configured to compare the voltage levels of the positive input clock signal (clk_in) and the negative input clock signal (/clk_in). The first charge control unit 113 controls charging of the first voltage V1 according to the comparison result that is obtained by the comparing unit 111. The second charge control unit 115 controls charging of the second voltage V2 according to the comparison result that is obtained by the comparing unit 111. The first charging unit 117 is charged with the first voltage V1 as controlled by the first charge control unit 113. The second charging unit 119 is charged with the second voltage V2 as controlled by the second charge control unit 115.

In the illustrated embodiment, the comparing unit 111 includes fourth to eighth transistors TR4 to TR8.

The fourth transistor TR4 includes a gate and a drain connected to a second node N2 and a source that is supplied with a voltage from the external power supply VDD. The fifth transistor TR5 includes a gate and a drain connected to a third node N3 and a source that is supplied with a voltage from the external power supply VDD. The sixth transistor TR6 includes a gate that receives the positive input clock signal (clk_in), a drain that is connected to the second node N2, and a source that is connected to a fourth node N4. The seventh transistor TR7 includes a gate that receives the negative input clock signal (/clk_in), a drain that is connected to the third node N3, and a source that is connected to the fourth node N4. The eighth transistor TR8 includes a gate that is supplied with the bias voltage Vbias, a drain that is connected to the fourth node N4, and a source that is connected to a ground.

The first charge control unit 113 includes ninth to fourteenth transistors TR9 to TR14.

The ninth transistor TR9 includes a gate that is connected to the second node N2, a source that is supplied with a voltage from the external power supply VDD, and a drain that is connected to a fifth node N5. The tenth transistor TR10 includes a gate that is connected to the third node N3, a source that is supplied with a voltage from the external power supply VDD, and a drain that is connected to a sixth node N6. The eleventh transistor TR11 includes a gate that is connected to the sixth node N6 and a drain that is connected to the fifth node N5. The twelfth transistor TR12 includes a gate and a drain both connected to the sixth node N6, and a source that is connected to a seventh node N7. The thirteenth transistor TR13 includes a gate that is connected to the seventh node N7, a drain that is connected to a source of the eleventh transistor TR11, and a source that is connected to a ground. The fourteenth transistor TR14 includes a gate and a drain those are connected to the seventh node N7, and a source that is connected to a ground.

The second charge control unit 115 includes fifteenth transistor TR15 to twentieth transistor TR20.

The fifteenth transistor TR15 includes a gate that is connected to the third node N3, a source that is supplied with a voltage from the external power supply VDD, and a drain that is connected to the eighth node N8. The sixteenth transistor TR16 includes a gate that is connected to the second node N2, a source that is supplied with a voltage from the external power supply VDD, and a drain that is connected to the ninth node N9. The seventeenth transistor TR17 includes a gate that is connected to the ninth node N9 and a drain that is connected to the eighth node N8. The eighteenth transistor TR18 includes a gate and a drain both connected to the ninth node N9, and a source that is connected to a tenth node N10. The nineteenth transistor TR19 includes a gate that is connected to the tenth node N10, a drain that is connected to a source of the seventeenth transistor TR17, and a source that is connected to a ground. The twentieth transistor TR20 includes a gate and a drain both connected to the tenth node N10, and a source that is connected to a ground.

The first charging unit 117 includes a first capacitor CAP1 that is provided between the fifth node N5 and a ground terminal and is configured to store the first voltage V1.

The second charging unit 119 includes a second capacitor CAP2 that is provided between the eighth node N8 and a ground terminal and is configured to store the second voltage V2.

When the voltage level of the positive input clock signal (clk_in) is at a high level, the amount of current flowing through the ninth transistor TR9 and the sixteenth transistor TR16 is larger than the amount of current flowing through the tenth transistor TR10 and the fifteenth transistor TR15. In this case, the amount of charge stored in the first capacitor CAP1 of the first charging unit 117 is larger than the charge stored in the second capacitor CAP2 of the second charging unit 119.

In contrast, when the voltage level of the positive input clock signal (clk_in) is at a low level and the voltage level of the negative input clock signal (/clk_in) is at a high level, the amount of current flowing through the tenth transistor TR10 and the fifteenth transistor TR15 is larger than the amount of current flowing through the ninth transistor TR9 and the sixteenth transistor TR16. In this case, the amount of charge stored in the second capacitor CAP2 is larger than the amount of charge stored in the first capacitor CAP1.

The current flowing from the ninth transistor TR9 to the eleventh transistor TR11 is proportional to the current I2-I1. I1 is the current flowing from the fourth transistor TR4 to the sixth transistor TR6 and I2 is the current flowing from the fifth transistor TR5 to the seventh transistor TR7. In contrast, the current flowing from the fifteenth transistor TR15 to the seventeenth transistor TR17 is proportional to I1-I2. Currents I1 and I2 change based on the duty ratio of the pair of input clock signals (clk_in) and (/clk_in). That is, if the high-level interval of the positive input clock signal (clk_in) is wider than the low-level interval thereof, then current I1 becomes larger than current I2. If the high-level interval of the positive input clock signal (clk_in) is narrower than the low-level interval thereof, the current I2 becomes larger than current I1. Thus, the first voltage V1 and the second voltage V2 load the duty ratio information of the pair of input clock signals (clk_in) and (/clk_in) by the voltage levels thereof.

The count control unit 120 is supplied with the first voltage V1 and the second voltage V2 from the duty ratio detecting unit 110. Then, the count control unit 120 includes a comparing unit that compares the first voltage V1 and the second voltage V2. Therefore, using the count control signal (cntctrl), the count control unit 120 can easily transmit the duty ratio information of the pair of input clock signals (clk_in) and (/clk_in) to the counter 130. Since the structures of the count control unit 120 and the counter 130 are generally understood by those skilled in the art, the detailed description thereof will be omitted.

As described above, the duty cycle correcting circuit according to the embodiments described herein can be configured to detect the duty ratio of the clock signals and to generate a duty ratio control signal comprising a plurality of bits. By using the plurality of bits of the duty ratio control signal, the duty cycle correcting circuit activates one pull-down unit of a differential amplifier that includes one pull-up unit and a plurality of pull-down units. Then, the pull-down unit controls the duty ratio of the output clock signals by using the resistance ratio of the elements that receive the pair of input clock signals, respectively.

That is, the duty cycle correcting circuit includes a single loop and performs a duty cycle correction operation on the clock signal. Therefore, as compared with the related art in which the rising edges of the two clocks need to be matched to each other to accurately perform the duty cycle correction operation, a stable operation can be performed even if changes in the PVT occur. Further, the duty cycle correcting circuit described herein can reduce the occupied area and the power consumption and design changes can be easily made.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A duty cycle correcting circuit, comprising:
   a duty ratio control signal generating block that receives input clock signals and detects a duty ratio of the input clock signals and generates a count control signal, and generates a duty ratio control signal comprising a plurality of bits in response to the count control signal; and
   a signal processing block that directly receives the input clock signals and controls voltage levels of output nodes to correspond to voltage levels of the input clock signals in response to the plurality of bits of the duty ratio control signal.

2. The duty cycle correcting circuit of claim 1, wherein the duty ratio control signal generating block generates the plurality of bits of the duty ratio control signal in which only one of a plurality of bits is at a first level.

3. The duty cycle correcting circuit of claim 1, wherein the duty ratio control signal generating block comprises:
   a duty ratio detecting unit that detects the duty ratio of the input clock signals and generates first and second voltages;
   a count control unit that generates the count control signal to correspond to the voltage levels of the first and second voltages; and
   a counter that performs a counting operation in response to the count control signal and generates the duty ratio control signal.

4. The duty cycle correcting circuit of claim 3, wherein the duty ratio detecting unit generates the first voltage that is to load lengths of high-level intervals of the input clock signals, and the second voltage that is to load lengths of low-level intervals of the input clock signals.

5. The duty cycle correcting circuit of claim 4, wherein the input clock signals comprise a positive input clock signal and a negative input clock signal whose phases are opposite to each other, and the duty ratio detecting unit includes:
   a comparing unit that is supplied with a bias voltage and compares voltage levels of the positive input clock signal and the negative input clock signal;
   a first charge control unit that controls generation of the first voltage according to the comparison result that is obtained by the comparing unit;
   a second charge control unit that controls generation of the second voltage according to the comparison result that is obtained by the comparing unit;
   a first charging unit that generates the first voltage according to the control of the first charge control unit; and
   a second charging unit that generates the second voltage according to the control of the second charge control unit.

6. The duty cycle correcting circuit of claim 3, wherein the count control unit generates the count control signal at a first level when the voltage level of the first voltage is higher than the voltage level of the second voltage, and generates the count control signal at a second level when the voltage level of the first voltage is lower than the voltage level of the second voltage.

7. The duty cycle correcting circuit of claim 6, wherein the counter increases logical values of the duty ratio control signals when the voltage level of the count control signal is at the first level, and decreases the logical values of the duty ratio control signals when the voltage level of the count control signal is at the second level.

8. The duty cycle correcting circuit of claim 1, wherein the signal processing block is activated in response to one bit of the plurality of bits of the duty ratio control signal, and the signal processing block comprises a plurality of signal processing units that control the voltage levels of the output nodes to correspond to the voltage levels of the input clock signals.

9. The duty cycle correcting circuit of claim 8, wherein the input clock signals comprise a positive input clock signal and a negative input clock signal whose phases are opposite to each other, the output nodes comprise a positive output node and a negative output node, and each of the plurality of signal processing units comprises:
   a first transistor that is provided between the negative output node and a first node and operates according to the control of the positive input clock signal;
   a second transistor that is provided between the positive output node and the first node and operates according to the control of the negative input clock signal; and
   a third transistor that is provided between the first node and a ground terminal and operates according to the control of one bit of the plurality of bits of the duty ratio control signals.

10. The duty cycle correcting circuit of claim 9, wherein the first transistor and the second transistor, have a different resistance ratio for each signal processing unit.

11. The duty cycle correcting circuit of claim 1, further comprising:
    a power supply block that supplies a voltage to the output nodes.

12. A duty cycle correcting circuit comprising:
    a duty ratio control signal generating block that detects a duty ratio of a pair of input clock signals and generates a duty ratio control signal comprising a plurality of bits; and
    a plurality of signal processing units, each of which is selectively activated by the plurality of bits of the duty ratio control signal, and generates a pair of output clock signals from the pair of input clock signals according to a driving force of elements that receive the pair of input clock signals, respectively.

13. The duty cycle correcting circuit of claim 12, wherein the plurality of signal processing units comprise a pull-up unit or a pull-down unit of a differential amplifier.

14. The duty cycle correcting circuit of claim 12, wherein the duty ratio control signal generating block generates the plurality of bits of the duty ratio control signals in which only one bit of a plurality of bits is at a first level.

15. The duty cycle correcting circuit of claim 12, wherein the duty ratio control signal generating block comprises:

a duty ratio detecting unit that detects the duty ratio of the pair of input clock signals and generates first and second voltages;

a count control unit that generates a count control signal to correspond to voltage levels of the first and second voltages; and a counter that performs a counting operation in response to the count control signal and generates the plurality of bits of the duty ratio control signal.

16. The duty cycle correcting circuit of claim 15, wherein the pair of input clock signals include a positive input clock signal and a negative input clock signal whose phases are opposite to each other, and the duty ratio detecting unit generates the first voltage that is to load a length of a high-level interval of the positive input clock signal, and the second voltage that is to load a length of a high-level interval of the negative input clock signal.

17. The duty cycle correcting circuit of claim 16, wherein the duty ratio detecting unit comprises:

a comparing unit that is supplied with a bias voltage and compares voltage levels of the positive input clock signal and the negative input clock signal;

a first charge control unit that controls charging of the first voltage according to the comparison result that is obtained by the comparing unit;

a second charge control unit that controls charging of the second voltage according to the comparison result that is obtained by the comparing unit;

a first charging unit that generates the first voltage according to the control of the first charge control unit; and a second charging unit that generates the second voltage according to the control of the second charge control unit.

18. The duty cycle correcting circuit of claim 15, wherein the count control unit generates the count control signal at a first level when the voltage level of the first voltage is higher than the voltage level of the second voltage, and generates the count control signal at a second level when the voltage level of the first voltage is lower than the voltage level of the second voltage.

19. The duty cycle correcting circuit of claim 18, wherein the counter increases a logical value of the duty ratio control signal when the voltage level of the count control signal is at the first level, and decreases the logical value of the duty ratio control signal when the voltage level of the count control signal is at the second level.

20. The duty cycle correcting circuit of claim 12, wherein the pair of input clock signals comprise a positive input clock signal and a negative input clock signal whose phases are opposite to each other, the pair of output clock signals comprise a positive output clock signal and a negative output clock signal whose phases are opposite to each other, and each of the plurality of signal processing units comprises a first transistor that is provided between a node where the negative output clock is generated and a first node, and operates according to the control of the positive input clock signal, a second transistor that is provided between a node where the positive output clock is generated and the first node, and operates according to the control of the negative input clock signal, and a third transistor that is provided between the first node and a ground terminal and operates according to the control of one bit of the plurality of bits of the duty ratio control signals, and wherein a driving force of the first and second transistors is different for each signal processing unit.

* * * * *